US009099914B2

United States Patent
Wissner et al.

(10) Patent No.: US 9,099,914 B2
(45) Date of Patent: Aug. 4, 2015

(54) PACKAGING OF POWER SUPPLY USING MODULAR ELECTRONIC MODULES

(75) Inventors: Kevin D. Wissner, Monroeville, PA (US); Edward A. Novack, New Kensington, PA (US)

(73) Assignee: SIEMENS AKTIENGESELLSCHAFT, München (DE)

( * ) Notice: Subject to any disclaimer, the term of this patent is extended or adjusted under 35 U.S.C. 154(b) by 405 days.

(21) Appl. No.: 13/535,655

(22) Filed: Jun. 28, 2012

(65) Prior Publication Data

US 2013/0003299 A1    Jan. 3, 2013

Related U.S. Application Data

(60) Provisional application No. 61/502,593, filed on Jun. 29, 2011.

(51) Int. Cl.
H05K 7/20    (2006.01)
H02M 7/00    (2006.01)
H05K 7/14    (2006.01)

(52) U.S. Cl.
CPC ............. *H02M 7/003* (2013.01); *H05K 7/1432* (2013.01); *H05K 7/20936* (2013.01)

(58) Field of Classification Search
CPC ..................... H05K 7/1432; H05K 7/20936
See application file for complete search history.

(56) References Cited

U.S. PATENT DOCUMENTS

| 5,625,545 A | 4/1997 | Hammond |
| 8,093,764 B2 * | 1/2012 | Hammond ................. 307/140 |
| 8,169,107 B2 * | 5/2012 | Hammond et al. ............. 307/52 |
| 2010/0328848 A1 * | 12/2010 | Ledezma et al. .............. 361/603 |
| 2010/0328883 A1 * | 12/2010 | Ledezma et al. .............. 361/690 |

FOREIGN PATENT DOCUMENTS

| CN | 201305432 Y | 9/2009 |
| CN | 201315432 Y | 9/2009 |
| GB | 2050703 A | 1/1981 |
| JP | H11122943 | 4/1999 |
| JP | 2004342739 A | 12/2004 |
| JP | 2006254673 | 9/2006 |
| JP | 2007074865 | 3/2007 |
| KR | 1019840006880 A | 2/1987 |
| KR | 1020100107734 A | 10/2010 |
| WO | 2008005485 A2 | 1/2008 |

OTHER PUBLICATIONS

PCT International Search Report mailed Sep. 11, 2012 corresponding to PCT International Application No. PCT/US2012/044803 filed Jun. 29, 2012. (7 pages).

* cited by examiner

*Primary Examiner* — Gregory Thompson

(57) ABSTRACT

An enclosure for a power supply is disclosed. The enclosure may include a control compartment configured to receive one or more control components, a transformer compartment positioned adjacent to the control compartment and configured to receive a transformer, and a power cell compartment positioned adjacent to the control compartment and the transformer compartment. The power cell compartment may be configured to receive a plurality of power cells arranged into a plurality of pods. The power cells may be received in the power cell compartment such that each power cell in a first pod is adjacent to at least two other power cells in the first pod. A voltage difference between adjacent power cells in a pod may be less than an acceptable voltage tolerance.

18 Claims, 9 Drawing Sheets

PACKAGING OF POWER SUPPLY USING MODULAR ELECTRONIC MODULES

CROSS-REFERENCE TO RELATED APPLICATIONS

This application claims the priority benefit of U.S. Provisional Patent Application No. 61/502,593 filed Jun. 29, 2011 and entitled "Packaging of Power Supply Using Modular Electronic Modules," the content of which is hereby incorporated by reference in its entirety.

BACKGROUND

The present disclosure relates to construction and packaging of a power supply. More specifically, the present disclosure relates to construction and packaging of a three-phase power supply using modular electronic modules.

Power supplies configured to control a flow of energy between a first alternating current (AC) system and a second AC system are used in a variety of commercial and industrial applications. For example, a power supply is typically used in AC motor control and operation systems. Various power supplies convert energy from a first frequency and voltage to a second frequency and voltage. One way to implement such a power supply is a drive including one or more power cells, each power cell including multiple solid state converters with an intermediate direct current (DC) link. One exemplary system incorporating such power cells is discussed in U.S. Pat. No. 5,625,545 to Hammond (the '545 patent), the disclosure of which is hereby incorporated by reference in its entirety.

Typically, a power supply such as that discussed in the '545 patent packaged in a single enclosure for easier transportation and set-up. FIG. 1 illustrates a power supply 100 packaged in a multi-cabinet enclosure 102. The enclosure 102 arranges the various components of the power supply 100 in a linear fashion. At one end of the enclosure 102, an input connector 104 is provided for operably connected the power supply 100 to a multi-phase input. In this example, input connector 104 is a configured for a three-phase power input. The input connector 104 is operably connected to a transformer 106 contained within a transformer cabinet in enclosure 102. The transformer 106 typically includes a single primary winding and multiple secondary windings. As discussed in the '545 patent, one example of such a transformer includes a single primary winding and nine secondary windings.

A plurality of power cells 108 are included within a power cell cabinet in the enclosure 102. Each of the power cells 108 is connected to a single secondary winding of the transformer 106. Each of the power cells 108 includes a chassis, a heat sink, a plurality of capacitors, a plurality of bus bars, various insulated gate bipolar transistors (IGBTs) and a plurality of diodes arranged and configured such that the power cell produces a single-phase output in response to a multi-phase input.

Each power cell may include an H-bridge assembly such as those shown in FIGS. 1b and 1c. As shown in FIG. 1b, a half-bridge design 120 may include, for example, a pair of solid state switches 122, 123 connected with each other in series, but in parallel with a capacitor 121. Alternatively, as shown in FIG. 1b, a Perfect Harmony H-bridge design 130 may include two pairs of solid state switches 124a, 124b and 125a, 125b may be connected in parallel with a capacitor 121.

The various power cells 108 may be arranged into columns or rows, each column or row related to a single rank or phase of the power cells. For example, four power cells 108 are arranged into row 110a, four power cells are arranged into row 110b, and four power cells are arranged into row 110c.

Each of the four power cells 108 in any given row is operably connected and configured to contribute to a single output. For example, each of the power cells 108 may be configured to produce 750 volts. Thus, power cell row 110a produces a maximum of 3000 volts line-to-neutral at a first phase, power cell row 110b produces a maximum of 3000 volts line-to-neutral at a second phase, and power cell row 110c produces a maximum of 3000 volts line-to-neutral at a third phase. As used herein, 3000 volts neutral may correspond to 5196 volts line-to-line. The three-phase power output by the power cell rows 110a, 110b and 110c is passed to a three-phase output connector (not shown in FIG. 1) where a load such as a motor may be operably attached to the power supply 100.

The power supply 100 also includes various control circuitry 112. The control circuitry 112 is configured to monitor the input at the primary winding of transformer 106, monitor the output of the secondary windings, monitor the operation of each of the power cells 108, and perform other various functions related to the operation of the power supply such as control ventilation through the enclosure 102. The control circuitry 112 is typically operably connected to an exterior control panel or a remote computing device. A user may monitor the operation of the power supply at the control panel or remote computing device, and alter various aspects of the operation of the power supply.

FIG. 1d illustrates an arrangement using an M2C half-bridge assembly (such as assembly 120 as shown in FIG. 1b). Which two or more modular multilevel converter systems 141, 142 are connected in parallel to a DC power source (identified by the P-N inputs) to form an inverter that delivers power to two or more loads 143, 144. Each system includes three inverter legs 145, 146, 147 made up of a set of series-connected inverter submodules 148a, . . . 148n. Although FIG. 11 shows eight submodules in each leg, any number of submodules are possible.

FIG. 1d also includes an expanded view of an exemplary submodule 150. The submodule includes two power semiconductors T1, T2 that are connected in series and which can be switched on and off. The semiconductors T1, T2, also referred to as solid state switches, may be insulated gate bipolar transistors (IGBTs), gate turn-off thyristors (GTOs) integrated gate-commutated thyristors (IGCTs) or the like. Each power semiconductor has a corresponding diode D1, D2 connected in parallel with it. An energy storage device such as a capacitor is connected in parallel with the semiconductors and diodes. Additional details about such a submodule are disclosed in U.S. Pat. No. 7,269,037 to Marquardt, and U.S. Pat. No. 7,960,871 to Dommaschk et al., the relevant disclosures of which is incorporated herein by reference.

Each inverter leg has a single-phase AC output 151, 152, 153 that supplies one phase of three-phase power for the load 143. The AC output is positioned at a midpoint such that an equal number of submodules are on either side of the AC output's electrical connection to the leg.

FIG. 1e illustrates a circuit diagram of a single phase bridge 160 of a five level inverter which combines two NPC (neutral point clamped) three level phase legs 161 with a common DC bus (with a positive rail 162, a negative rail 163, and a midpoint 164) to provide an NPC H-bridge. The NPC three level phase legs include electrical switches 165 which are shown as IGBTs (Insulated Gate Bipolar Transistors). Other useful switches include UFOs (Gate Turn Off Thyristors) and IGCTs (Integrated Gate Commutated Thyristors). The switches are paired with anti-parallel freewheeling diodes 166 to accommodate the inductive motor load currents. A controller 167 is used for controlling each of the switches.

The controller may comprise, for example, a computer, a microcomputer, a microprocessor, or, in a preferred embodiment, a digital signal processor.

A capacitor 168 bank 169 midpoint (at DC midpoint 164) and the clamping diodes connected between capacitor bank midpoint and switches S1/S2 and S3/S4 respectively keep the maximum DC working voltage across any switch from exceeding one half of the DC bus voltage (Vdc/2), provided the DC filter capacitor midpoint voltage is maintained at Vdc/2, Regulators are built into the modulator to keep the midpoint voltage at Vdc/2 to guard against long term unequal discharge of the two capacitor bank halves. The resistor network 170 across the DC bus capacitor bank serves as a fixed safely bleed resistor and a balance network for initial capacitor charging. An example of such a bridge is further taught in U.S. Pat. No. 6,058,031 issued May 2, 2000 to Lyons et al. and entitled "Five Level High Power Motor Drive Converter and Control System," the content of which is hereby incorporated by reference in its entirety.

Power supplies such as power supply 100 are commonly used as motor drives in remote areas or areas where space is limited. The multi-cabinet design of the enclosure 102 provides for easier transportation as each cabinet is transported separately and operably connected and configured on site. However, this arrangement requires a space around the power supply for maneuvering the individual cabinets into place, and, once the cabinets are assembled, the completed enclosure occupies a large footprint. It should be noted that while power cells configured to produce 750 volts are shown in the example above, other power cells may be used. For example, power cells configured to produce from about 480 volts to about 1375 volts may be used.

SUMMARY

This disclosure is not limited to the particular systems, devices and methods described, as these may vary. The terminology used in the description is for the purpose of describing the particular versions or embodiments only, and is not intended to limit the scope.

As used in this document, the singular forms "a," "an," and "the" include plural references unless the context clearly dictates otherwise. Unless defined otherwise, all technical and scientific terms used herein have the same meanings as commonly understood by one of ordinary skill in the art. Nothing in this document is to be construed as an admission that the embodiments described in this document are not entitled to antedate such disclosure by virtue of prior invention. As used in this document, the term "comprising" means "including, but not limited to."

In an embodiment, an enclosure for a power supply may include a control compartment configured to receive one or more control components, a transformer compartment positioned adjacent to the control compartment and configured to receive a transformer, and a power cell compartment positioned adjacent to the control compartment and the transformer compartment. The power cell compartment may be configured to receive a plurality of power cells arranged into a plurality of pods. The power cells may be received in the power cell compartment such that each power cell in a first pod is adjacent to at least two other power cells in the first pod. A voltage difference between adjacent power cells in a pod may be less than an acceptable voltage tolerance.

In an embodiment, a power supply may include a transformer having a primary winding and a plurality of secondary windings, a plurality of power cells operably connected to the transformer such that each of the plurality of secondary windings is connected to a single power cell, and an enclosure. The enclosure may include a control compartment configured to receive one or more control components, a transformer compartment positioned adjacent to the control compartment and configured to receive the transformer, and a power cell compartment positioned adjacent to the control compartment and the transformer compartment. The power cell compartment may be configured to receive the plurality of power cells arranged into a plurality of pods. The power cells may be received in the power cell compartment such that each power cell in a first pod is adjacent to at least two other power cells in the first pod. A voltage difference between adjacent power cells in a pod may be less than an acceptable voltage tolerance.

In an embodiment, a system may include a load and a power supply operably connected to the load. The power supply may include a transformer having a primary winding and a plurality of secondary windings, a plurality of power cells operably connected to the transformer such that each of the plurality of secondary windings is connected to a single power cell, and an enclosure. The enclosure may include a control compartment configured to receive one or more control components, a transformer compartment positioned adjacent to the control compartment and configured to receive the transformer, and a power cell compartment positioned adjacent to the control compartment and the transformer compartment. The power cell compartment may be configured to receive the plurality of power cells arranged into a plurality of pods, wherein the power cells are received in the power cell compartment such that each power cell in a first pod is adjacent to at least two other power cells in the first pod. A voltage difference between adjacent power cells in a pod may be less than an acceptable voltage tolerance.

DETAILED DESCRIPTION

For the purposes of discussion below, the terms "low voltage" and "medium voltage" are relative to each other and are intended to include the general meanings recognized by those skilled in the art. For example, the term "low voltage" may refer to a voltage level less than or equal to 1,000 volts, or less than or equal to 600 volts. The term "medium voltage" may refer to a voltage level from a floor of 600 volts, or 1,000 volts to a ceiling of 35,000 volts (35 kV). The term "electrically connected" refers to two or more components that are part of a circuit such that a current may flow through the components, or the components share a common voltage, either directly or via one or more intermediate components.

The present disclosure is directed to a single-cabinet enclosure for packaging the various components of a power supply similar to power supply 100 as discussed above. The single-cabinet enclosure may have a smaller footprint than enclosure 102 as discussed above in reference to FIG. 1, resulting from a reorganization and rearrangement of the power supply components. The single-cabinet enclosure as discussed herein may be sized such that it fits within a standard shipping container for easy transportation to remote sites such as off-shore oil drilling platforms.

Figure 1A:
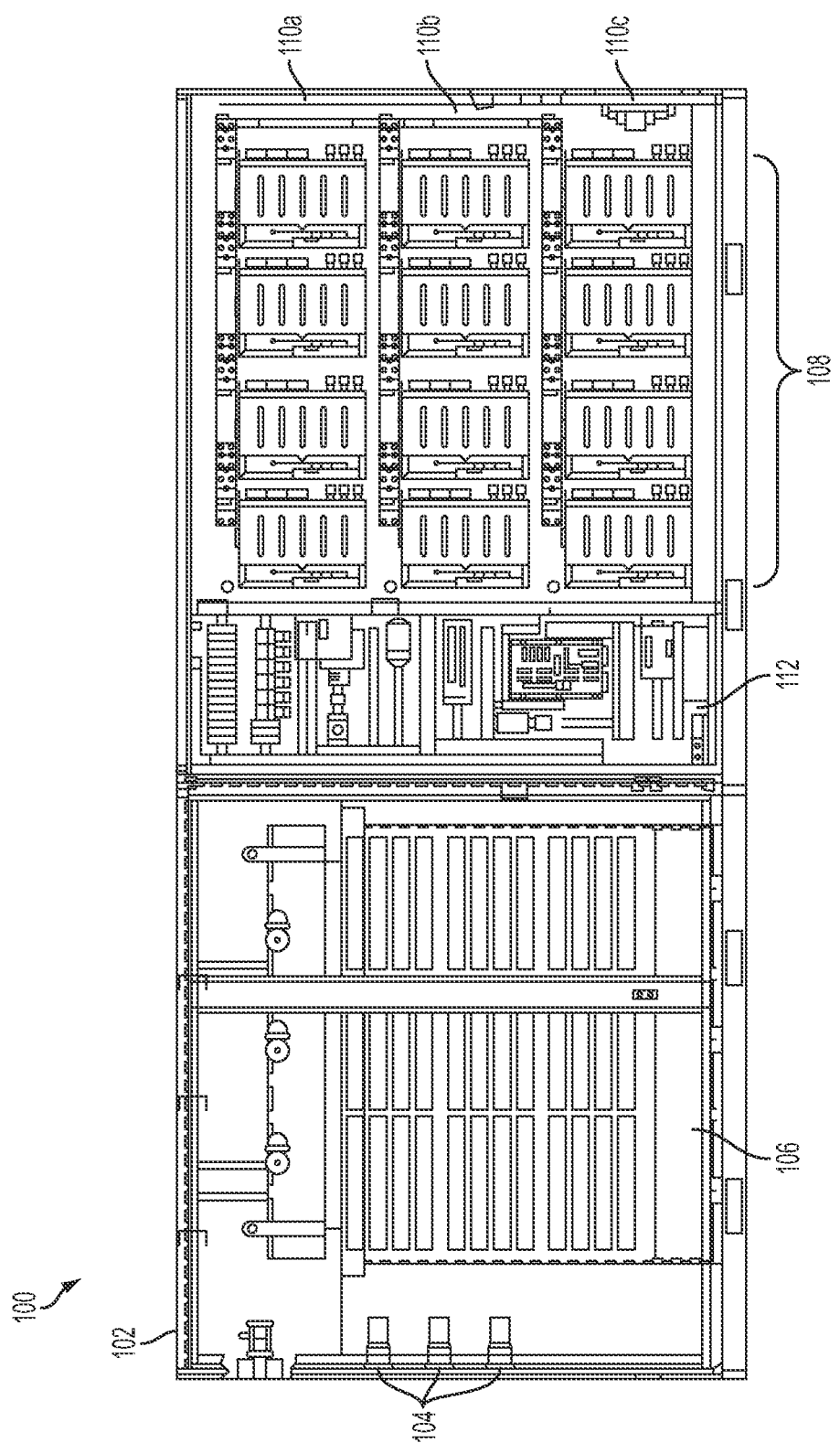
FIG. 1a illustrates an example of a power supply in a linear-style enclosure.
Figure 1C:
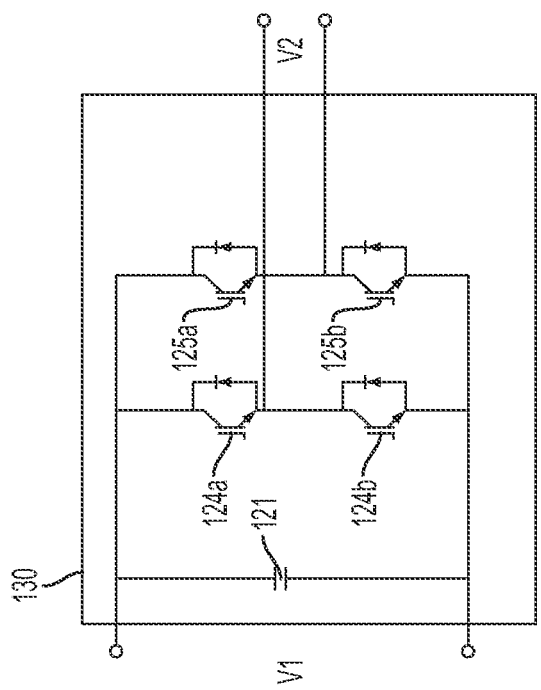
FIGS. 1b and 1c illustrate examples of H-bridge topologies.
Figure 1B:
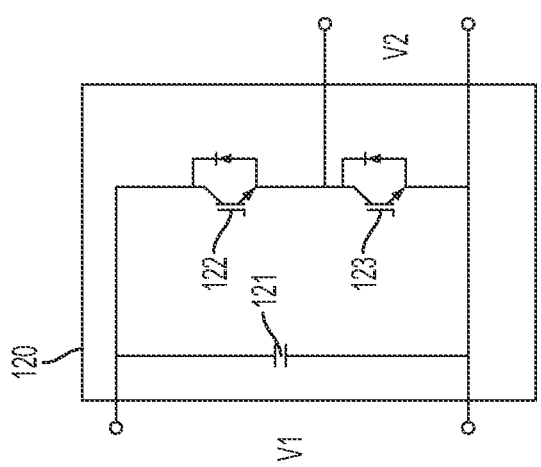
Figure 1D:
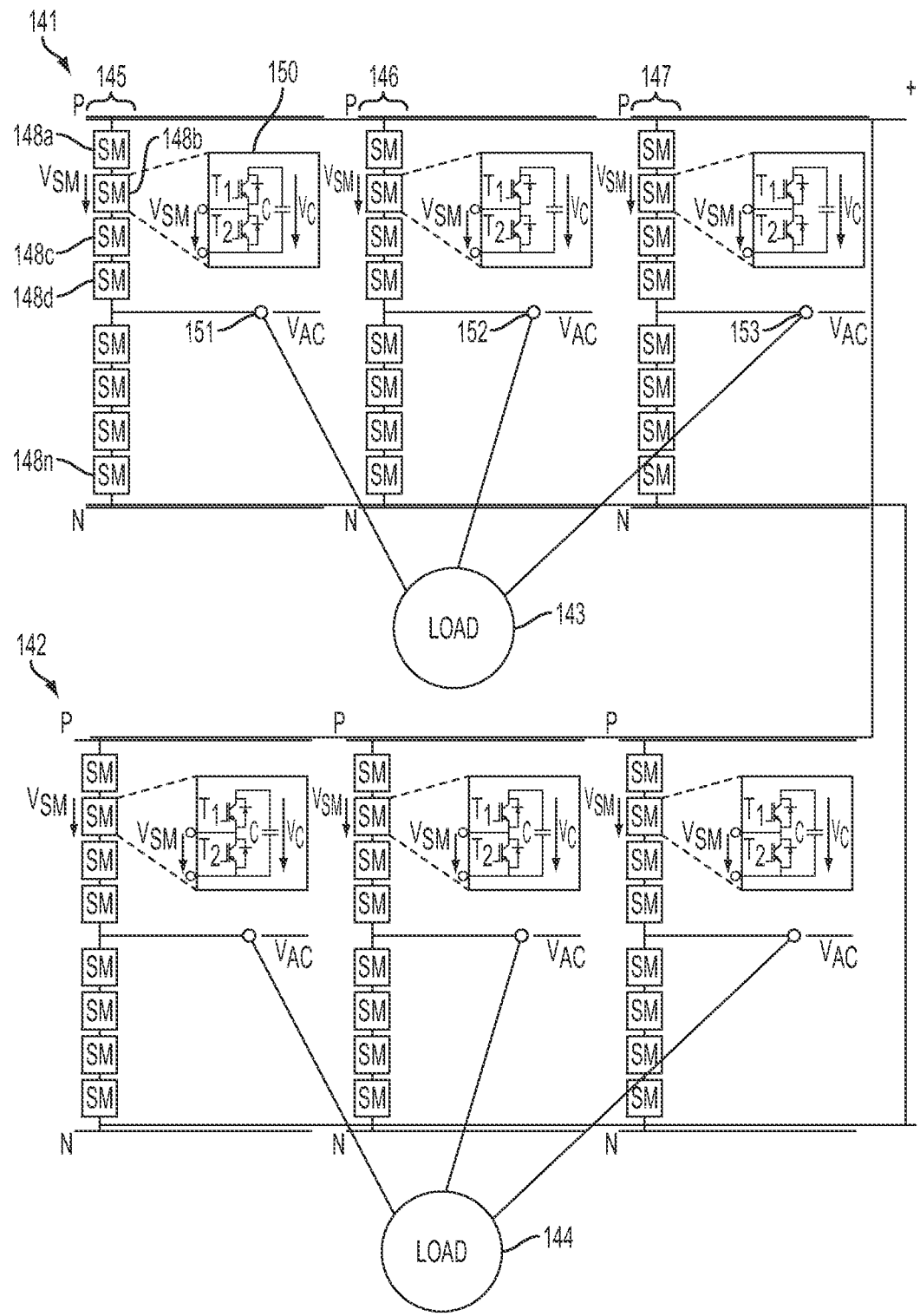
FIGS. 1d and 1e illustrate examples of bridge layouts.
Figure 1E:
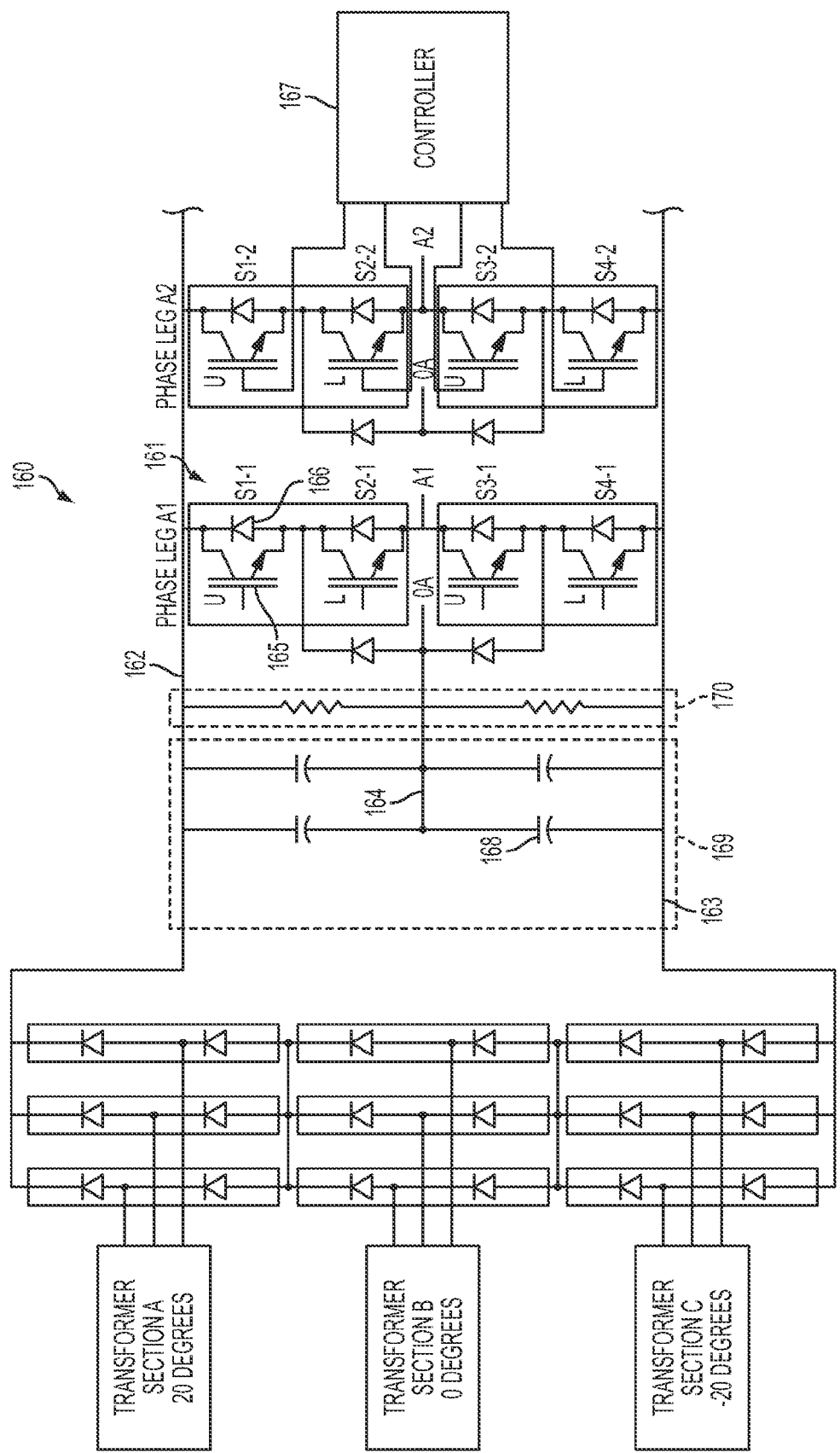
Figure 2:
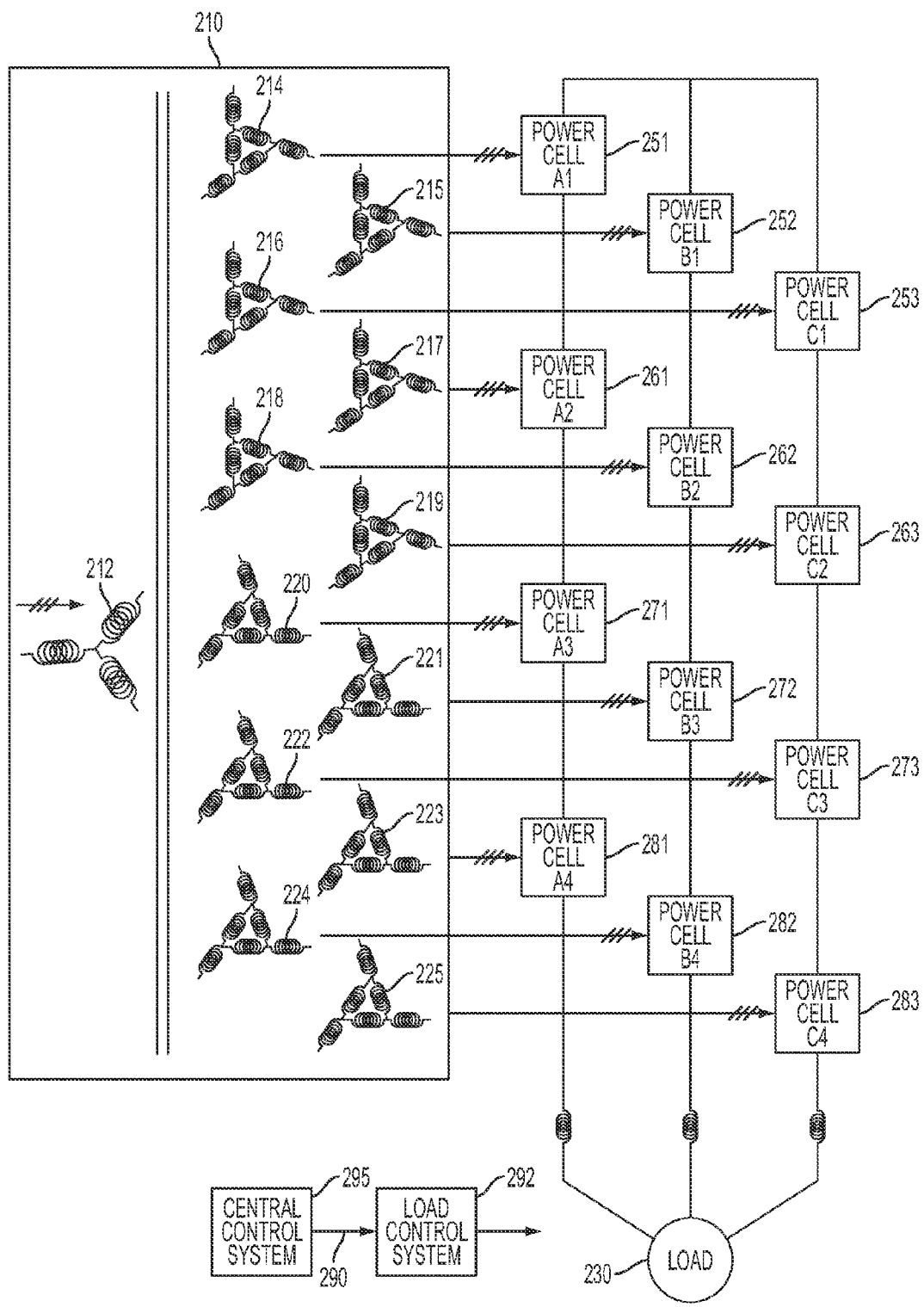
FIG. 2 shows an illustrative circuit comprising a plurality of power cells connected to a load.

FIG. 2 shows an illustrative power supply. A multi-winding machine such as a source or input transformer 210 delivers three-phase, medium-voltage power to a load 230 such as a three-phase induction motor via an array of single-phase inverters (also referred to herein as power cells). As used herein, the term "transformer" is intended to include any multi-winding machine that is normally on the supply side of the system. The transformer 210 may include (primary windings 212 that excite a number of secondary windings 214-225. Although primary winding 212 is illustrated as having a star configuration, a mesh configuration is also possible. Further, although secondary windings 214-225 are illustrated as having a mesh configuration, star-configured secondary windings are possible, or a combination of star and mesh windings may be used. Further, the number of secondary windings illustrated in FIG. 2 is merely exemplary, and other numbers of secondary windings are possible.

Any number of three-phase sets of power cells may be connected between the transformer 210 and the load 230. The system may include a first set or "rank" of power cells 251-253 (power cells A1, B1 and C1) across the three phases of the load, a second rank of power cells 261-263 (power cells A2, B2 and C2), a third rank of power cells 271-273 (power cells A3, B3 and C3), and a fourth rank of power cells 281-283 (power cells A4, B4 and C4). Fewer than four sets or ranks, or more than four sets or ranks, are possible. Each corresponding position in each rank (i.e., A position, B position and C position) may be connected in series to form each phase of the three-phase output. As shown in FIG. 2, the power cells 251, 261, 271 and 281 (power cells A1, A2, A3 and A4) are connected in series to produce a first phase of the output the A series). The power cells 252, 262, 272 and 282 (power cells B1, B2, B3 and B4) are connected in series to produce a second phase of the output (e.g., the B series). The power cells 253, 263, 273 and 283 (power cells C1, C2, C3 and C4) are connected in series to produce a third phase of the output (e.g., the C series).

A master or central control system 295 sends command signals to a local controller 292 and/or cell-level controls in each cell over fiber optics or another wired or wireless communications medium 290. Both the local controller 292 and the central control system 295 may be a processing device having an associated memory configured to store instructions, algorithms and equations used to perform various calculations. Similarly, both local controller 292 and the central control system 295 may include input/output devices configured to receive and transmit data between various components.

Figure 3:
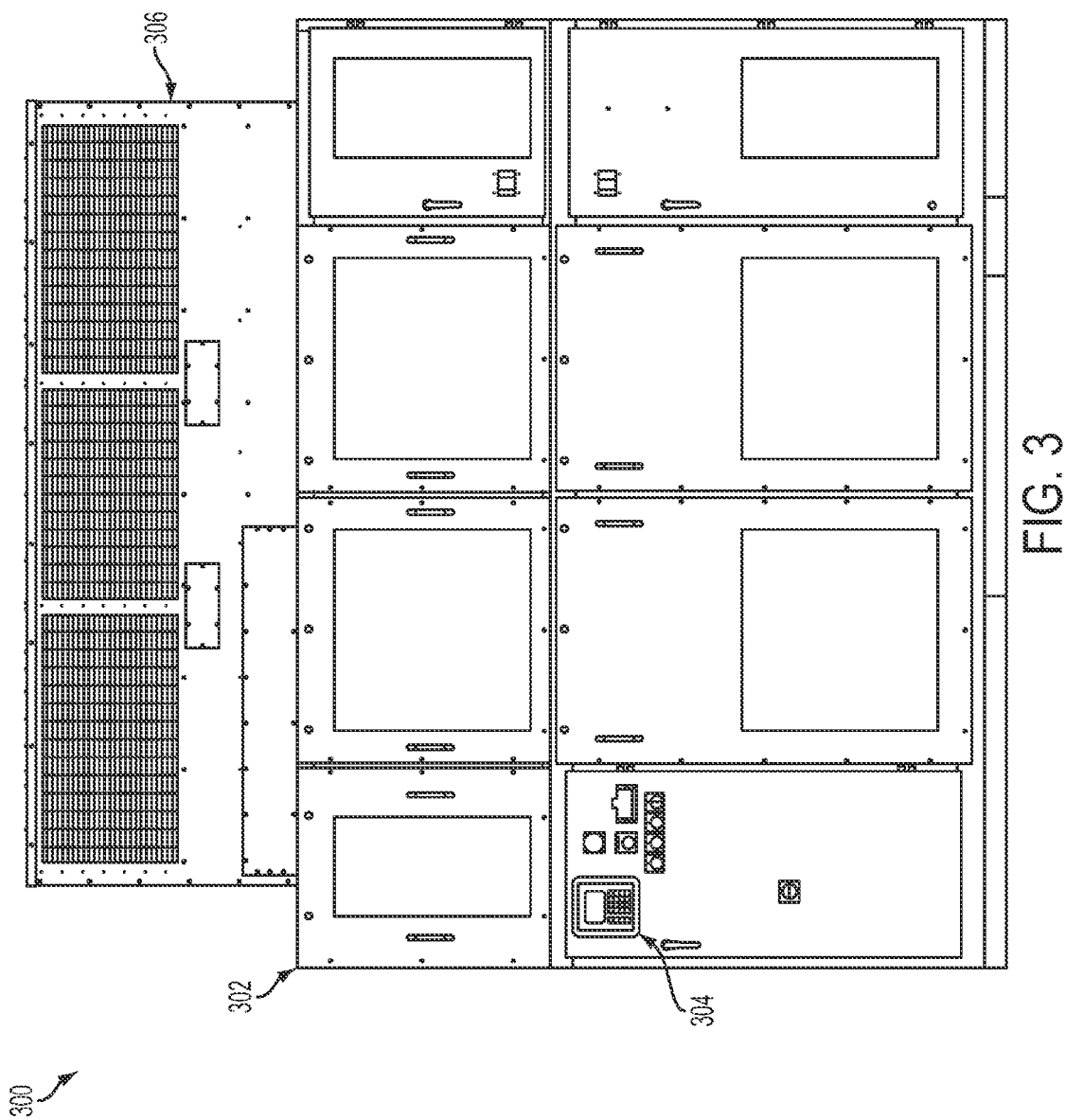
FIG. 3 shows an illustrative enclosure for a power supply configured to have a reduced footprint according to an embodiment of the invention.

FIG. 3 shows an illustrative power supply 300, such as the power supply shown in FIG. 2, packaged within a single-cabinet enclosure 302. The enclosure 302 may be adapted and configured to house various components of the power supply 300. The exterior of enclosure 302 may include various controls and information display devices 304 such that a customer or technician can verify operating parameters and the current operating status of the power supply 300. Additionally, multiple doors or other access means may be provided for providing access to various components contained within the enclosure 302. A blower assembly 306 may be positioned adjacent to the enclosure 302 to provide air flow for cooling various components of the power supply 300. As shown in FIG. 3, the blower assembly 306 may be placed on the top of the enclosure 302, thereby reducing an overall footprint of the completed power supply 300 assembly.

Figure 4:
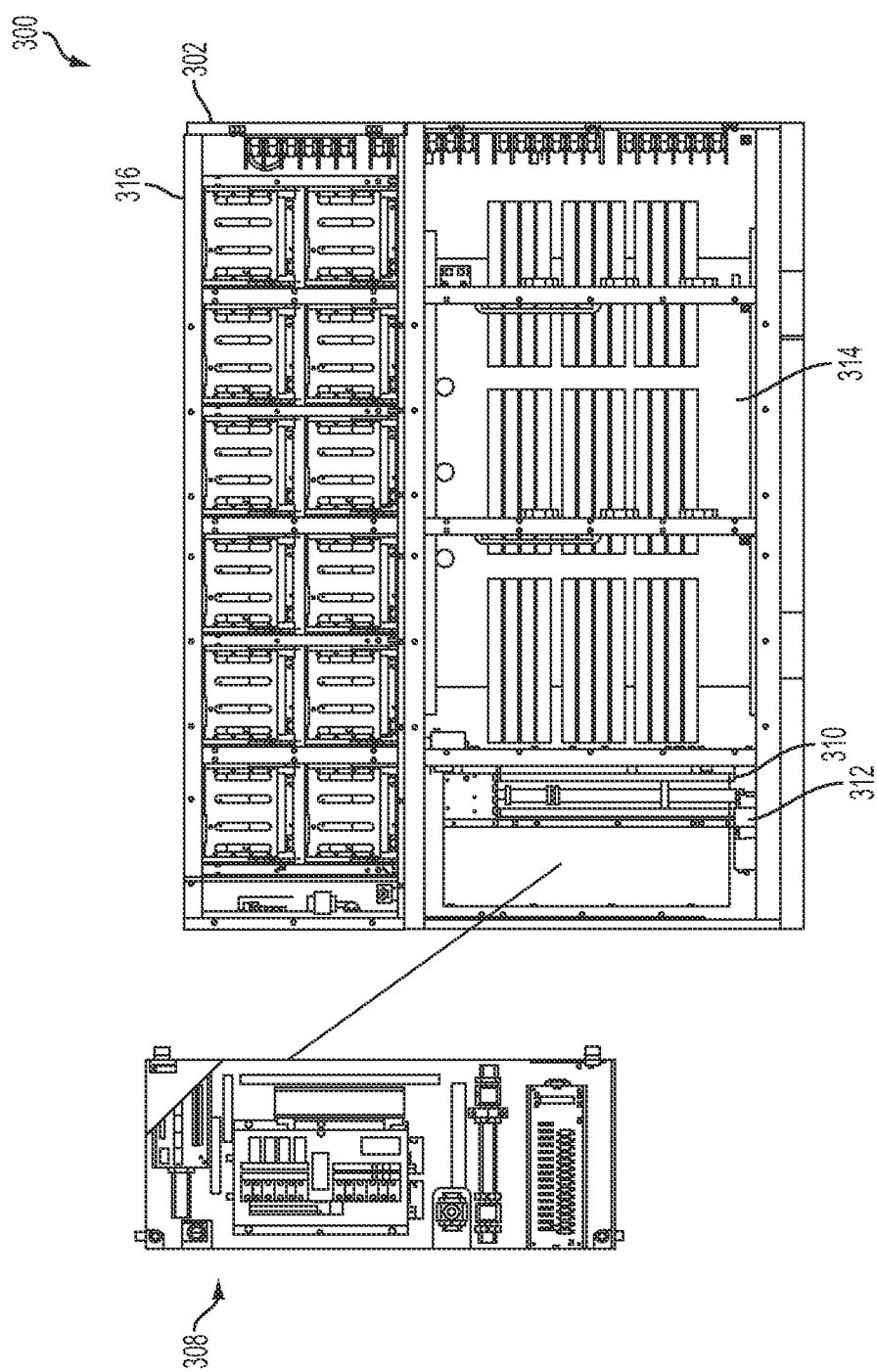
FIG. 4 shows the illustrative enclosure of FIG. 3 with various doors and panels removed to show an arrangement of components there according to an embodiment.

FIG. 4 shows the power supply 300 in enclosure 302 with the various doors, access means and blower assembly 306 removed. The enclosure 302 may be arranged and configured to house the various functional components of the power supply 300 into a single cabinet. For example, referring to FIG. 2, the transformer 210, the power cells 251-253, 261-263, 271-273 and 281-283, the central control system 295 and the load control system 290 may be arranged within enclosure 302 in a single cabinet.

For illustrative purposes, FIG. 4 shows the enclosure 302 with controller module 308 removed. The controller module 308 may be hinged with various components positioned behind it within the enclosure 302. The controller module 308 may include central control system 295, the load control system 290, circuitry for communicating with various components within the power supply 300 such as controls and information display devices 304, and other similar controller circuitry and components. Positioned adjacent the controller module within the enclosure, and accessible from the front of the enclosure, may be an input connection 310 and an output connection 312. The input connection may be configured to operably connect to a three-phase input such as power received from a utility company or other similar power source. The output connection 312 may provide a customer with a connection point for attaching a load to the power supply 300.

The enclosure 302 may include a transformer compartment 314 positioned adjacent the controller module 308 and configured to fit a transformer such as transformer 210 as described in FIG. 2. The transformer compartment may include various supports, mounts, bus bars, connectors and other components for securely mounting the transformer and operably connecting the transformer to the input connection 310. Similarly, control wiring such as fiber optics may operably connect the controller module 308 and the transformer so that the control module may monitor the operating parameters of the transformer.

Depending on the operating parameters of the transformer, the transformer compartment 314 may be sized to provide adequate spacing between the transformer and other various components. Additionally, the transformer compartment 314 may be shielded from low voltage components such as those contained within the controller module 308.

A power cell compartment 316 may be positioned adjacent both the controller module 308 and the transformer compartment 314 within the enclosure 302. As shown in FIG. 4, the power cell compartment 316 may be positioned across the top of the enclosure 302. The power cell compartment 316 may be configured to receive multiple power cells such as power cells 251-253, 261-263, 271-273 and 281-283 as shown in FIG. 2. Similar to the transformer compartment 314, the power cell compartment 316 may be shielded from low voltage components such as those contained within the controller module 308.

The power cell compartment 316 may include various supports, mounts, bus bars, connectors and other components for securely receiving and mounting the power cells and operably connecting the power cells to the transformer and the output connection 312. Each power cell is designed identically, thus providing a modular set of modules that can be inserted into and removed from the power cell compartment 316 as needed. Additionally, control wiring such as fiber optics may operably connect the controller module 308 to the individual power cells so that the control module may monitor the operating parameters of the power cells.

As discussed above, each power cell is configured to produce a certain output voltage. As the cells as arranged in series (e.g., the A series 251, 261, 271 and 281, the B series 252, 262, 272 and 282, and the C series 253, 263, 273 and 283 as shown in FIG. 2), this output voltage of each individual cell is added to produce a single output. For example, each of the power cells ma be configured to produce 750 volts. In a 4 power cell series, the total voltage output is 3000 volts. However, the output at the individual cells is: Cell 1=750 volts, Cell 2=1500 volts, Cell 3=2250 volts, and Cell 4=3000 volts. This results in a voltage difference of 2250 volts between Cell 1 and Cell 4. In designing and arranging the components of the enclosure 302, it may be important to limit the absolute voltage difference between adjacent cells to, for example, no more than two times the production capability of an individual cell. So, in the above example, the voltage difference between adjacent cells may be limited to 1500 volts (i.e., 2*750 volts). Minimizing the voltage difference may result in reducing any worst-case failure scenarios such as arcing between the outputs of the individual power cells due to a large voltage difference. Additionally, by minimizing the voltage difference between power cells, the clearance required between cells is reduced, providing for a more compact arrangement of the power cells.

Figure 5A:
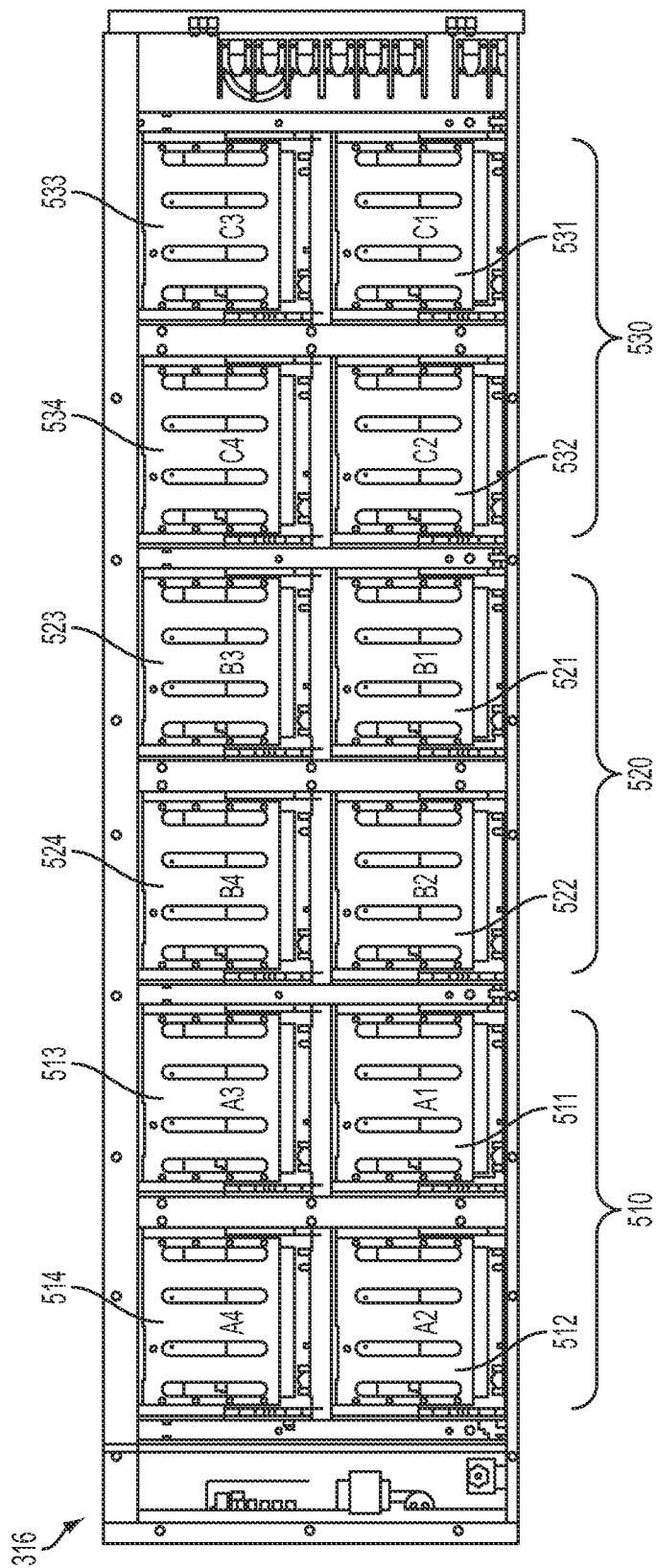
FIG. 5A shows an illustrative view of a power cell arrangement according to an embodiment.

To achieve this limited voltage difference, the series of cells may be arranged into a specific grouping or pods within the power cell compartment 316, as opposed to the conventional column or row arrangement of the prior art. FIG. 5A shows a close-up of an illustrative arrangement of power cells within the power cell compartment 316. A first pod 510 may include the A series of power cells, power cells 511, 512, 513 and 514 in this example, corresponding to power cells A1, A2, A3 and A4 respectively. In this example, the power cells are arranged such that power cell 511 (A1) is in the bottom right corner of the pod 510, power cell 512 (A2) is in the bottom left of the pod, power cell 513 (A3) is in the upper right of the pod, and power cell 514 (A4) is in the upper left of the pod. Thus, in this arrangement, each power cell is adjacent to two power cells from the same series. In the prior art column or row arrangement, each end power cell is only adjacent to one other power cell in the same series.

The arrangement of power cells in pod 510 produces absolute voltage differences between adjacent power cells that are no more than two times the production capability of an individual cell. For example, as before, each power cell is capable of producing 750 volts. Thus, power cell 511 outputs 750 volts, power cell 512 outputs 1500 volts, power cell 513 outputs 2250 volts, and power cell 514 outputs 3000 volts. Power cell 511 is positioned adjacent to power cells 512 and 513. The absolute voltage difference between power cells 511 and 512 is 750 volts, and the absolute voltage difference between power cells 511 and 513 is 1500 volts. Each of these absolute voltage differences is within the acceptable tolerance of no more than two times the production capability of an individual cell, i.e., 1500 volts. Similarly, power cell 512 is positioned adjacent to power cells 511 and 514. The absolute voltage difference between power cells 512 and 511 is 750 volts, and the absolute voltage difference between power cells 512 and 514 is 1500 volts, again within the acceptable tolerance.

Additional pods within the power cell compartment 316 may be arranged similarly. A second pod 520 may include the 13 series of power cells, power cells 521, 522, 523 and 524 in this example, corresponding to power cells B1, B2, B3 and B4 respectively. In this example, the power cells are arranged such that power cell 521 (B1) is in the bottom right corner of the pod 520, power cell 522 (B2) is in the bottom left of the pod, power cell 523 (B3) is in the upper right of the pod, and power cell 524 (B4) is in the upper left of the pod. A third pod 530 may include the C series of power cells, power cells 531, 532, 533 and 534 in this example, corresponding to power cells C1, C2, C3 and C4 respectively. In this example, the power cells are arranged such that power cell 531 (C1) is in the bottom right corner of the pod 520, power cell 532 (C2) is in the bottom left of the pod, power cell 533 (C3) is in the upper right of the pod, and power cell 534 (C4) is in the upper left of the pod.

This arrangement may minimize the acceptable tolerance for adjacent cells that are not in the same pod. For example, power cell 511 (in pod 510) is also adjacent to power cell 522 (in pod 520). Power cell 511 is configured to output 750 volts and power cell 522 is configured to output 1500 volts, an absolute voltage difference of 750 volts, which is within the acceptable tolerance. However, phase angles between adjacent cells that are not in the same pod should be considered. For example, power cell 513 (in pod 510) is also adjacent to power cell 524 (in pod 520). The power cell 513 is configured to out 2250 volts and power cell 524 is configured to output 3000 volts. While the absolute voltage difference is 750 volts, the phase angle offsets may require increased electrical clearances to support an acceptable tolerance. This is common problem in motor drive design, but is limited in the designs as shown herein.

It should be noted the number and arrangement of power cells in FIG. 5A is shown by way of example only. Additionally, acceptable voltage tolerance may be selected based upon safety regulations applicable to the design and operation of the power supply 300. Additional designs and arrangements that satisfy any design criteria may be used to position the power cells within the power cell compartment 316.

Figure 5B:
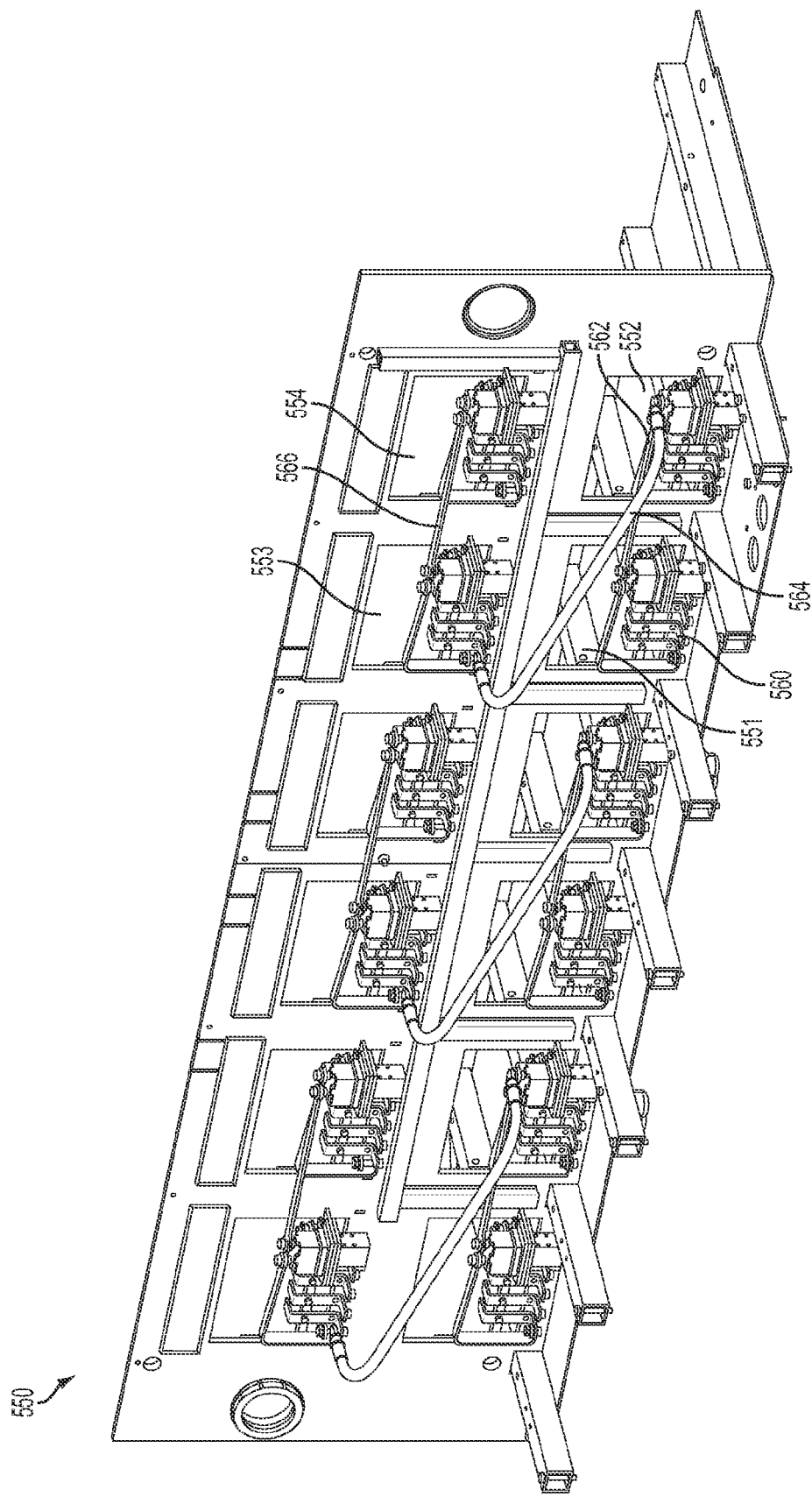
FIG. 5B shows an illustrative arrangement of a backplane for power cells according to an embodiment.

FIG. 5B shows an illustrative backplane 550 for power cell compartment 316. It should be noted that various components within the backplane repeat for each pod of cells and, as such, only the components for a single pod of cells is discussed herein. The backplane includes slots 551, 552, 553 and 554 configured to receive and operably connect to a pod of power cells, e.g. pod 510 as shown in FIG. 5A. An example of such as backplane can be found in U.S. Pat. No. 8,018,735, issued Sep. 13, 2011 to Kunkle et al. and entitled "Electronic Module and Interlocking Bus System Including Same," the content of which is hereby incorporated by reference in its entirety. As such, slot 551 may be configured to receive and operably connect to power cell 511, slot 552 may be configured to receive and operably connect to power cell 512, slot 553 may be configured to receive and operably connect to power cell 513, and slot 554 may be configured to receive and operably connect to power cell 514. Each of slots 551, 552, 553 and 554 may include a bus bar and connector assembly for operably connecting to the power cells, such as bus bar assembly 560 in slot 551. An electrical connector such as bus bar 562 may operably connected the bus bar assembly 560 of slot 551 to a bus bar assembly of 552, thereby providing the output of the power cell received in slot 551 as the input of the power cell received in slot 552. Similarly, an electrical connector such as wire 564 may operably connect the bus bar assembly of slot 552 to the bus bar assembly of slot 553, such that the output of the power cell received in slot 552 is received as the input of the power cell received by slot 553. An electrical connector such as bus bar 566 may operably connect the bus bar assembly of slot 553 to a bus bar assembly of 554, such that the output of the power cell received in slot 553 is received as the input of the power cell received by slot 554. A wire or other similar conductor may operably connect the output of the bus bar assembly of slot 554 to a first phase of the output connection 312 of the enclosure 302.

The wire 564 may be sized and shielded appropriately for the voltage output by the power cell received by slot 552, plus any additional required tolerances. For example, slot 552 may be operably connected to power cell 512, which is outputting 1500 volts at 1500 amps. The wire 564 may be sized and shielded appropriately to carry 2000 volts at 2000 amps.

By providing the transformer compartment 314 and the power cell compartment 316 in a vertical configuration, improved airflow through the enclosure 302 may be realized. As shown in FIGS. 3 and 4, a parallel linear path may be followed from the bottom of the enclosure 302, through the transformer compartment 314 and the power cell compartment 316 via a uniform rear plenum to the blower assembly 306. This provides an efficient cooling system as a single set of blowers can provide cooling to each component of the power supply simultaneously. This arrangement may also reduce the amount of debris that is drawn through the enclosure during cooling. The arrangement may reduce the number of air input and output vents, reducing the number of places that a foreign object can enter the enclosure during operation. The arrangement may also reduce the sound pressure level in the surrounding environment. Depending on the operating parameters of the power supply, additional cooling such as liquid cooling, heat sinks, or other similar cooling systems may be integrated to provide additional cooling for operational components such as the transformer 210.

Additionally, the arrangement of components as shown in FIGS. 3 and 4, including the removable blower assembly 306, provides for an efficient power supply to transport, unpack, assembly, and initiate. The power supply may be packed in a standard shipping container for transport via a flatbed truck, cargo plane, cargo ship, train, or other similar transportation means. Once on site, the power supply can be removed from the shipping container, situated into position, the blower assembly is attached, supply power is attached to the input terminal, the load is attached to the output terminals, and the controller module is programmed with any customer specific instructions and the power supply can begin operation, The smaller size and footprint of the current design optimizes installation as transportation is regulated, no special containers or shipping means is required, a smaller footprint is used, thereby reducing space that may be limited (e.g., on an offshore oil drilling platform), and lifting into position is optimized as the design incorporates a single, compact cabinet design.

Various of the above-disclosed and other features and functions, or alternatives thereof, may be combined into many other different systems or applications. Various presently unforeseen or unanticipated alternatives, modifications, variations or improvements therein may be subsequently made by those skilled in the art, each of which is also intended to be encompassed by the disclosed embodiments.

What is claimed is:

1. An enclosure for a power supply comprising:
   a control compartment configured to receive one or more control components;
   a transformer compartment positioned adjacent to the control compartment and configured to receive a transformer; and
   a power cell compartment positioned adjacent to the control compartment and the transformer compartment, the power cell compartment configured to receive a plurality of power cells arranged into a plurality of pods, wherein first power cells of a first pod are arranged in series to produce a single output, wherein the plurality of power cells are received in the power cell compartment such that each first power cell in the first pod is adjacent to at least two other first power cells in the first pod, and wherein a voltage difference between adjacent power cells in a pod is less than an acceptable voltage tolerance.

2. The enclosure of claim 1, further comprising a blower assembly positioned adjacent to the power cell compartment and configured to provide air circulation through a parallel path between the transformer compartment and the power cell compartment.

3. The enclosure of claim 1, wherein the power cell compartment is further configured to receive the plurality of power cells such that the voltage difference between adjacent power cells in different pods is within the acceptable voltage tolerance.

4. The enclosure of claim 1, wherein the plurality power cells comprises an H-bridge type power cell.

5. A power supply comprising:
   a transformer comprising a primary winding and a plurality of secondary windings;
   a plurality of power cells operably connected to the transformer such that each of the plurality of secondary windings is connected to a single power cell; and
   an enclosure comprising:
      a control compartment configured to receive one or more control components,
      a transformer compartment positioned adjacent to the control compartment and configured to receive the transformer, and
      a power cell compartment positioned adjacent to the control compartment and the transformer compartment, the power cell compartment configured to receive the plurality of power cells arranged into a plurality of pods, wherein first power cells of a first pod are arranged in series to produce a single output, wherein the plurality of power cells are received in the power cell compartment such that each first power cell in the first pod is adjacent to at least two other first power cells in the first pod, and wherein a voltage difference between adjacent power cells in a pod is less than an acceptable voltage tolerance.

6. The power supply of claim 5, wherein the enclosure further comprises a blower assembly positioned adjacent to the power cell compartment and configured to provide air circulation through a parallel path between the transformer compartment and the power cell compartment.

7. The power supply of claim 5, further comprising:
   an input connector operably connected to the transformer and configured to receive input power; and
   an output connector operably connected to at least a portion of the plurality of power cells.

8. The power supply of claim 5, wherein the power cell compartment is further configured to receive the plurality of power cells such that the voltage difference between adjacent power cells in different pods is within the acceptable voltage tolerance.

9. The power supply of claim 5, wherein the plurality power cells comprises an H-bridge type power cell.

10. A system comprising:
a load; and
a power supply operably connected to the load, the power supply comprising:
   a transformer comprising a primary winding and a plurality of secondary windings,
   a plurality of power cells operably connected to the transformer such that each of the plurality of secondary windings is connected to a single power cell, and
   an enclosure comprising:
      a control compartment configured to receive one or more control components,
      a transformer compartment positioned adjacent to the control compartment and configured to receive the transformer, and
      a power cell compartment positioned adjacent to the control compartment and the transformer compartment, the power cell compartment configured to receive the plurality of power cells arranged into a plurality of pods, wherein first power cells of a first pod are arranged in series to produce a single output, wherein the plurality of power cells are received in the power cell compartment such that each first power cell in the first pod is adjacent to at least two other first power cells in the first pod, and wherein a voltage difference between adjacent power cells in a pod is less than an acceptable voltage tolerance.

11. The system of claim 10, wherein the enclosure further comprises a blower assembly positioned adjacent to the power cell compartment and configured to provide air circulation through a parallel path between the transformer compartment and the power cell compartment.

12. The system of claim 10, wherein the power supply further comprises a operable connection compartment configured to receive input and output connections, the operable connection compartment comprising:
   an input connector operably connected to the transformer and configured to receive input power; and
   an output connector operably connected to at least a portion of the plurality of power cells.

13. The system of claim 10, wherein the power cell compartment is further configured to receive the plurality of power cells such that the voltage difference between adjacent power cells in different pods is within the acceptable voltage tolerance.

14. The system of claim 10, wherein the load is a multi-phase motor.

15. The system of claim 10, wherein the plurality power cells comprises an H-bridge type power cell.

16. The enclosure of claim 1, wherein an absolute voltage difference between adjacent power cells in a pod is no more than two times a production capability of an individual power cell in the pod.

17. The power supply of claim 5, wherein an absolute voltage difference between adjacent power cells in a pod is no more than two times a production capability of an individual power cell in the pod.

18. The system of claim 10, wherein an absolute voltage difference between adjacent power cells in a pod is no more than two times a production capability of an individual power cell in the pod.

* * * * *